(12) United States Patent
Metzger et al.

(10) Patent No.: US 8,350,418 B2
(45) Date of Patent: Jan. 8, 2013

(54) CIRCUIT AND METHOD FOR GENERATING A REFERENCE VOLTAGE

(75) Inventors: Andre G. Metzger, Newbury Park, CA (US); Anise M. Azizad, Winnetka, CA (US); Aleksey Lyalin, Thousand Oaks, CA (US); Peter Phu Tran, Corona, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 465 days.

(21) Appl. No.: 12/572,337

(22) Filed: Oct. 2, 2009

(65) Prior Publication Data

US 2011/0080153 A1 Apr. 7, 2011

(51) Int. Cl.
*H02J 7/00* (2006.01)
(52) U.S. Cl. ......... 307/150; 327/540; 327/574; 323/273
(58) Field of Classification Search ............ 307/35, 307/39, 151, 64, 66, 327, 328, 150; 327/314, 327/362, 512, 595, 574, 584, 529, 535; 323/272–275, 280, 281, 289, 226, 314, 907
See application file for complete search history.

(56) References Cited

U.S. PATENT DOCUMENTS

| | | | | |
|---|---|---|---|---|
| 3,956,661 A * | 5/1976 | Sakamoto et al. | ............ | 327/513 |
| 4,313,082 A * | 1/1982 | Neidorff | ............ | 323/312 |
| 4,335,346 A * | 6/1982 | Streit | ............ | 323/313 |
| 5,198,701 A * | 3/1993 | Davies et al. | ............ | 327/513 |
| 5,250,826 A | 10/1993 | Chang et al. | | |
| 6,329,868 B1 * | 12/2001 | Furman | ............ | 327/513 |
| 6,891,357 B2 * | 5/2005 | Camara et al. | ............ | 323/316 |
| 6,906,359 B2 | 6/2005 | Zampardi et al. | | |
| 7,109,800 B2 * | 9/2006 | Noh et al. | ............ | 330/296 |
| 7,301,322 B2 * | 11/2007 | Choi | ............ | 323/315 |
| 7,408,335 B1 * | 8/2008 | Wong et al. | ............ | 323/316 |

FOREIGN PATENT DOCUMENTS

| | | |
|---|---|---|
| KR | 10-2004-0034674 | 4/2004 |
| KR | 10-2009-0078837 | 7/2009 |
| WO | WO 03/019771 A1 | 3/2003 |
| WO | WO 2008/054649 A1 | 5/2008 |

* cited by examiner

*Primary Examiner* — Rajnikant Patel
(74) *Attorney, Agent, or Firm* — Knobbe Martens Olson & Bear, LLP

(57) ABSTRACT

A circuit for generating a reference voltage includes a first transistor configured to receive a reference system voltage, the first transistor configured as a current source, the first transistor configured to provide a current independent of the system voltage, a plurality of diode devices configured to receive the current provided by the first transistor, and a second transistor associated with the plurality of diode devices, the second transistor configured to compensate for process variations in the first transistor, such that the plurality of diode devices provides a reference voltage that is at least partially compensated for the process variations.

19 Claims, 6 Drawing Sheets

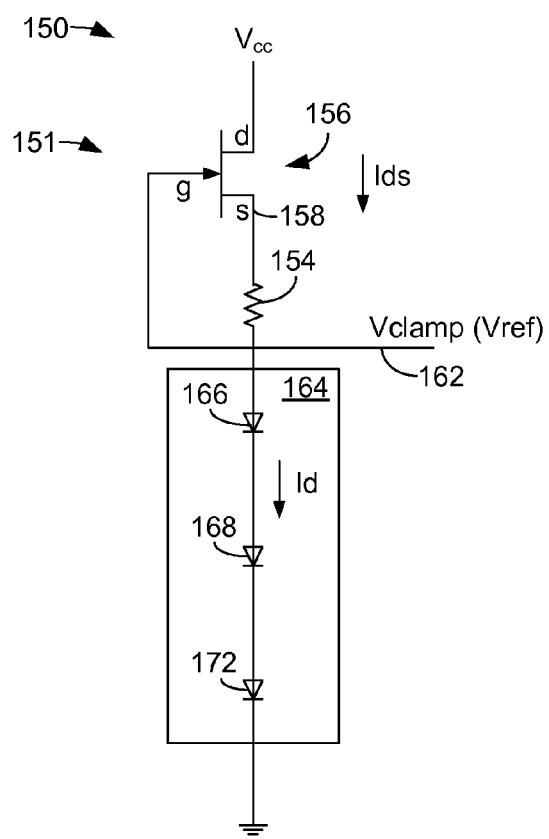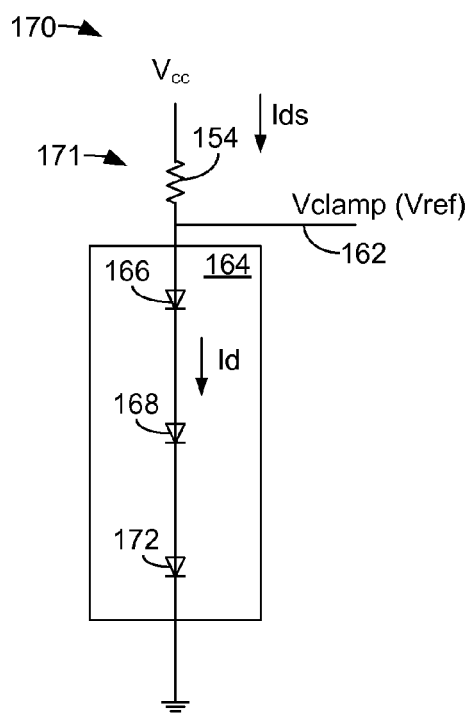
FIG. 2A  FIG. 2B

CIRCUIT AND METHOD FOR GENERATING A REFERENCE VOLTAGE

BACKGROUND

Portable communication devices, such as cellular telephones, use one or more power amplifiers to amplify an information signal prior to transmission. In some applications, an external voltage source is supplied to the power amplifier to provide the power amplifier with a reference voltage separate from a power supply voltage for the power amplifier. However, there are many applications in which a power amplifier may be implemented in a system that does not provide an external reference voltage. In such systems, the reference voltage must be generated on the power amplifier die, or chip.

Unfortunately, generating an accurate and stable reference voltage on the power amplifier chip can be problematic due to process, voltage and temperature (PVT) variations and other factors. This is particularly problematic in group III-V semiconductor manufacturing processes such as Gallium Arsenide (GaAs) Heterojunction Bipolar Transistor (HBT) technology, which currently dominates the handset power amplifier market.

In addition, because the power supply voltage (typically provided by a battery) provided to a power amplifier circuit fluctuates in output voltage with use due to charge and drain cycles, providing a reference voltage that is independent of the fluctuation of the battery voltage is also problematic.

Therefore, it would be desirable to have a way of generating a stable reference voltage on a power amplifier chip.

SUMMARY

Embodiments of the invention include a circuit for generating a reference voltage, comprising a first transistor configured to receive a reference system voltage, the first transistor configured as a current source, the first transistor configured to provide a current independent of the system voltage, a plurality of diode devices configured to receive the current provided by the first transistor, and a second transistor associated with the plurality of diode devices, the second transistor configured to compensate for process variations in the first transistor, such that the plurality of diode devices provides a reference voltage that is at least partially compensated for the process variations.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, but illustrate the principles of the invention. Moreover, in the figures, like reference numerals designate corresponding parts throughout the different views.

FIG. 2A is a schematic diagram illustrating a basic voltage reference generator circuit.

FIG. 2B is a schematic diagram illustrating an alternative embodiment of a basic voltage reference generator circuit.

DETAILED DESCRIPTION

Figure 1:
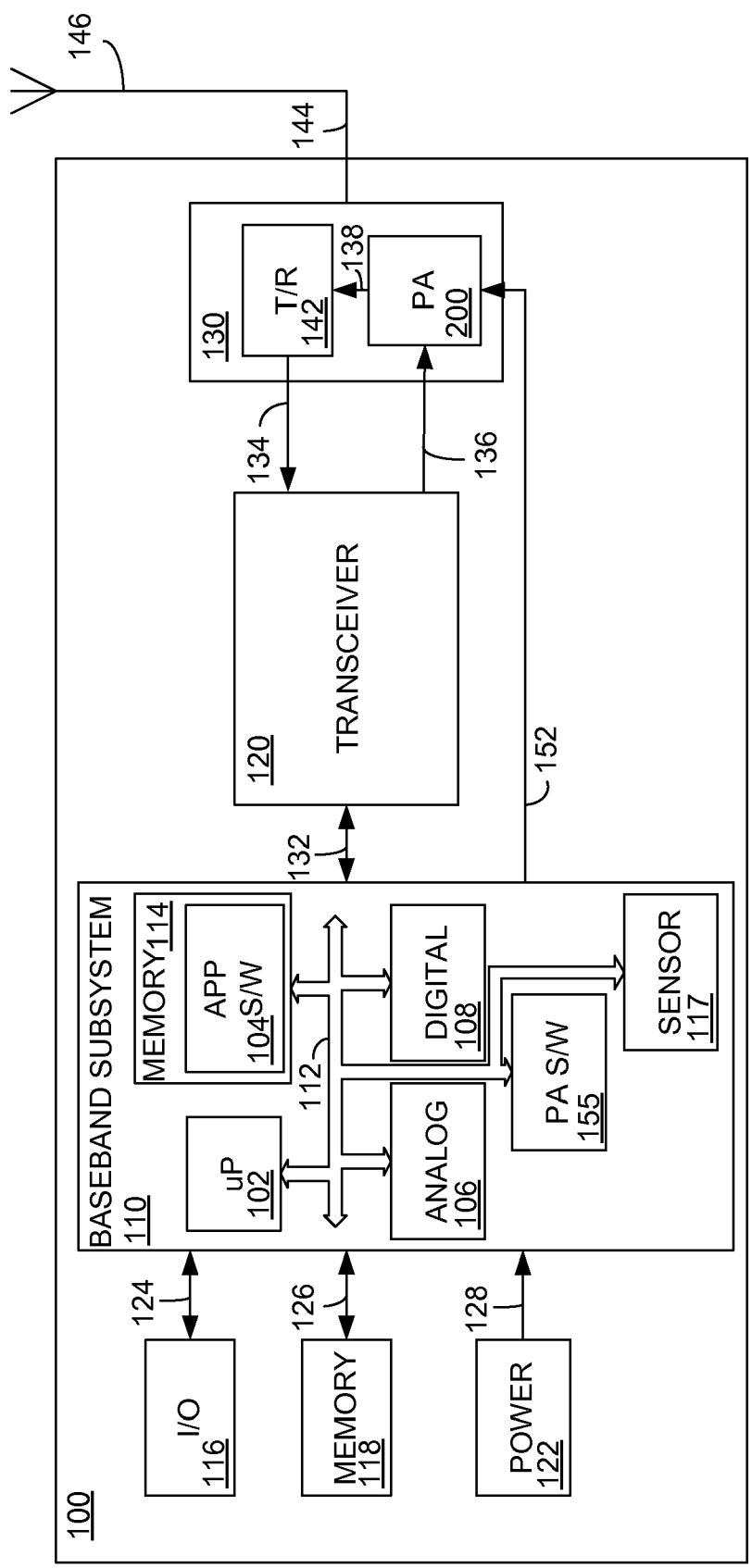
FIG. 1 is a block diagram illustrating a simplified portable communication device.

The circuit and method for generating a reference voltage is generally implemented in hardware. However, one or more of the signals that control the circuit and method for generating a reference voltage can be implemented in software, or a combination of hardware (e.g., using a hardware sensor) and software. When implemented in hardware, the circuit and method for generating a reference voltage can be implemented using specialized hardware elements. When one or more of the control signals for the circuit and method for generating a reference voltage are generated at least partially in software, the software portion can be used to precisely control the operating aspects of various components in a reference voltage circuit and a bias circuit associated with a device. The software can be stored in a memory and executed by a suitable instruction execution system (microprocessor). The hardware implementation of the circuit and method for generating a reference voltage may include any or a combination of the following technologies, which are all well known in the art: discrete electronic components, a discrete logic circuit(s) having logic gates for implementing logic functions upon data signals, an application specific integrated circuit having appropriate logic gates, a Programmable Gate Array(s) (PGA), a Field Programmable Gate Array (FPGA), a separate, specially designed integrated circuit for biasing purposes, etc.

Although described with particular reference to a portable transceiver, the circuit and method for generating a reference voltage can be implemented in any electronic device in which it is desirable to provide a reference voltage. The circuit and method for generating a reference voltage is particularly applicable to technologies where a complimentary device is not available. For example, embodiments of the circuit for generating a reference voltage are described below in a merged GaAs HBT-Field Effect Transistor (FET) technology. In the examples shown the FET is a specialized device integrated with the HBT having characteristics similar to a depletion-mode (d-mode) Metal Semiconductor Field Effect Transistor (MESFET). This integrated circuit manufacturing technology is commonly referred to as BiFET, but alternative nomenclature and integration techniques exist to combine an HBT and a FET. Further, while there are advantages to integrating a d-mode FET into bipolar-only (BJT or HBT) processes, processes that have only enhancement-mode (e-mode) FETs available can also be used to generate a reference voltage with the circuit and method to be described.

Further, the circuit and method for generating a reference voltage can also be applicable to Silicon (Si) bipolar processes, but is primarily applicable to semiconductor technologies in the group III-V material system, such as Gallium Arsenide (GaAs), Indium-Phosphide (InP), Gallium Nitride (GaN) and other combinations of group III-V materials, including ternary and quaternary semiconductor combinations.

FIG. 1 is a block diagram illustrating a simplified portable communication device 100. In an embodiment, the portable communication device 100 can be a portable cellular telephone. Embodiments of the circuit and method for generating a reference voltage can be implemented in any device having an RF transmitter, and in this example, are implemented in a portable communication device 100. The portable communication device 100 illustrated in FIG. 1 is intended to be a simplified example of a cellular telephone and to illustrate one of many possible applications in which the circuit and method for generating a reference voltage can be implemented. One having ordinary skill in the art will understand the operation of a portable cellular telephone, and, as such, implementation details are omitted. The portable communication device 100 includes a baseband subsystem 110, a transceiver 120, and a Front-End Module (FEM) 130. Although not shown for clarity, the transceiver 120 generally includes modulation and upconversion circuitry for preparing a baseband information signal for amplification and transmission, and includes filtering and downconversion circuitry for receiving and downconverting an RF signal to a baseband information signal to recover data. The details of the operation of the transceiver 120 are known to those skilled in the art.

The baseband subsystem generally includes a processor 102, which can be a general purpose or special purpose microprocessor, memory 114, application software 104, analog circuit elements 106, digital circuit elements 108, a current/voltage (UV) sensor 117, and power amplifier software 155, coupled over a system bus 112. The system bus 112 can include the physical and logical connections to couple the above-described elements together and enable their interoperability.

An input/output (I/O) element 116 is connected to the baseband subsystem 110 over connection 124, a memory element 118 is coupled to the baseband subsystem 110 over connection 126 and a power source 122 is connected to the baseband subsystem 110 over connection 128. The I/O element 116 can include, for example, a microphone, a keypad, a speaker, a pointing device, user interface control elements, and any other device or system that allows a user to provide input commands and receive outputs from the portable communication device 100.

The memory 118 can be any type of volatile or non-volatile memory, and in an embodiment, can include flash memory. The memory element 118 can be permanently installed in the portable communication device 100, or can be a removable memory element, such as a removable memory card.

The power source 122 can be, for example, a battery, or other rechargeable power source, or can be an adaptor that converts AC power to the correct voltage used by the portable communication device 100. In an embodiment, the power source can be a battery that provides a nominal voltage output of approximately 3.6 volts (V). However, the output voltage range of the power source can range from approximately 3.0 to 6.0 V.

The processor 102 can be any processor that executes the application software 104 to control the operation and functionality of the portable communication device 100. The memory 114 can be volatile or non-volatile memory, and in an embodiment, can be non-volatile memory that stores the application software 104. If portions of the control logic of the circuit and method for generating a reference voltage are implemented in software, then the baseband subsystem 110 also includes power amplifier software 155, which may cooperate with control logic that can be executed by the microprocessor 102, or by another processor, to control at least some aspects of the operation of the circuit and method for generating a reference voltage and/or the power amplifier 200 to be described below. In an embodiment, the IN sensor 117 receives performance information from the power amplifier 200 and provides an input to the power amplifier software 155, so that various aspects of the power amplifier 200 can be controlled.

The analog circuitry 106 and the digital circuitry 108 include the signal processing, signal conversion, and logic that convert an input signal provided by the I/O element 116 to an information signal that is to be transmitted. Similarly, the analog circuitry 106 and the digital circuitry 108 include the signal processing, signal conversion, and logic that convert a received signal provided by the transceiver 120 to an information signal that contains recovered information. The digital circuitry 108 can include, for example, a Digital Signal Processor (DSP), an FPGA, or any other processing device. Because the baseband subsystem 110 includes both analog and digital elements, it is sometimes referred to as a mixed signal circuit.

In an embodiment, FEM 130 includes a Transmit/Receive (T/R) switch 142 and a power amplifier 200. The T/R switch 142 can be a duplexer, a diplexer, or any other physical or logical device or circuitry that separates a transmit signal and a receive signal. Depending on the implementation of the portable communication device 100, the T/R switch 142 may be implemented to provide half-duplex or full-duplex functionality. A transmit signal provided by the transceiver 120 over connection 136 is directed to the power amplifier 200. As will be described in detail below, the power amplifier 200 can be implemented to include a circuit for generating a reference voltage that efficiently provides a reference voltage to the power amplification device irrespective of the battery voltage, and in a way that compensates for process and voltage variations within the power amplifier 200. The output of the power amplifier 200 is provided over connection 138 to the T/R switch 142, and then to an antenna 146 over connection 144.

A signal received by the antenna 146 is provided over connection 144 to the T/R switch 142, which provides the received signal over connection 134 to the transceiver 120.

In an embodiment, the baseband subsystem 110 provides one or more control signals to the power amplifier 200 over connection 152. Connection 152 can be implemented as discrete connections, or as a bus having multiple signals. In an embodiment, a power, or mode selection, signal, a power amplifier enable signal, one or more reference voltage levels, and other control signals for one or more switch elements are provided over connection 152 to the power amplifier 200.

FIG. 2A is a schematic diagram illustrating a basic voltage reference generator circuit 150. The circuit 150 comprises a current source 151 and a diode clamp circuit 164.

In an embodiment, the current source 151 comprises a depletion mode (d-mode) FET 156 fabricated using semiconductor materials from group III and group V, commonly referred to as a III-V semiconductor, and a resistor 154. However, it is also possible to construct a d-mode FET using silicon, or other materials or material systems, and such a device is within the scope of this disclosure.

In the embodiment shown in FIG. 2A, the current source 151 formed by the FET 156 and the resistor 154 decouples the system power supply voltage, Vcc, from the reference voltage, Vref (sometimes referred to as Vclamp) on node 162. The feedback provided by the resistor 154 at the source of FET 156 can help desensitize the response of current source 151 to variations in the system power supply voltage, Vcc. However, the FET 156 functions as a current source with or without the resistor 154. Resistor 154 can be omitted by simply connecting the gate of FET 156 and the source of FET 156 to node 162. However, both current source topologies (with or without resistor 154) introduce device parameter sensitivity. It is well known that critical FET process parameters such as the turn-on threshold voltage $V_t$ of the FET and the parameter $I_{DSS}$ that describes the drain current at a gate-source voltage, Vgs=0 (e.g., when the gate of FET 156 is connected to node 162).

The current source 151 of FIG. 2A is sensitive to the parameter $V_t$ as evident from the basic equation that models the FET forward active drain-to-source current: $I_{ds} \approx K/2 \cdot (V_{gs}-V_t)^2$, where K is a modeling parameter used for curve fitting.

This equation remains a valid approximation of the current Ids as long as Vds>Vgs−Vt. With resistor 154 omitted, the gate-source voltage, Vgs, of the FET 156 is set to Vgs=0 and the current Ids is resolved solely from the fitting parameter κ and process parameter Vt. This bias condition (Vgs=0) also defines the modeling parameter $I_{DSS}$, which is used to characterize d-mode FETs. As long as Vds>Vgs−Vt, the current source is relatively insensitive to voltage variation on the drain terminal, such as power supply fluctuations. When resistor 154 is included, as in FIG. 2A, the combination of the FET 156 and the resistor 154 continues to act as a current source, but the resistor 154 adds negative feedback. The quadratic equation for Ids can be solved by setting $V_{gs}=I_{ds} \cdot R$, where R is the value of resistor 154.

The diode clamp circuit 164 comprises one or more diodes, illustrated in this embodiment using PN-junction diode elements, and is illustrated in FIG. 2A using three diode elements: 166, 168 and 172. The nonlinear forward-ON characteristics of the diodes 166, 168 and 172 is used to generate a relatively constant reference voltage (Vref or Vclamp) at node 162 that is at least partially compensated from variations in the current, Ids. An ideal diode can be represented by a constant voltage drop when in forward-active mode. A real diode has a less ideal response that follows an exponential curve described by:

$$I_d \approx I_s \cdot \left(e^{\frac{V_D}{nV_{TH}}} - 1\right),$$

where $V_{TH}$ is the thermal voltage, where $V_{TH}$ is approximately 26 mV at room temperature, and n is the ideality factor which ranges between 1 and 2 for any given process. By this equation, the variation of the voltage, Vref, at node 162 is minimal for a limited range of Iref, where Iref=$I_{ds}$ of the current source 151. A solution for Vref can be obtained by setting Ids in the previous equation to the current, Id, of the diode clamp circuit 164.

FIG. 2B is a schematic diagram illustrating an alternative embodiment of a basic voltage reference generator circuit comprising a single resistor current source 171 and a diode clamp circuit 164. The current source 171 is implemented using a single resistor 154, where I=V/R. For a small change in voltage ΔV, the change in current ΔI will be given by: ΔI=ΔV/R. When ΔV<<V then ΔI<<I, and the function is near to that of a current source. The structure shown in FIG. 2B can be effective when only minor fluctuations in Vcc are present in the system and/or if a d-mode FET is not available.

Figure 3:
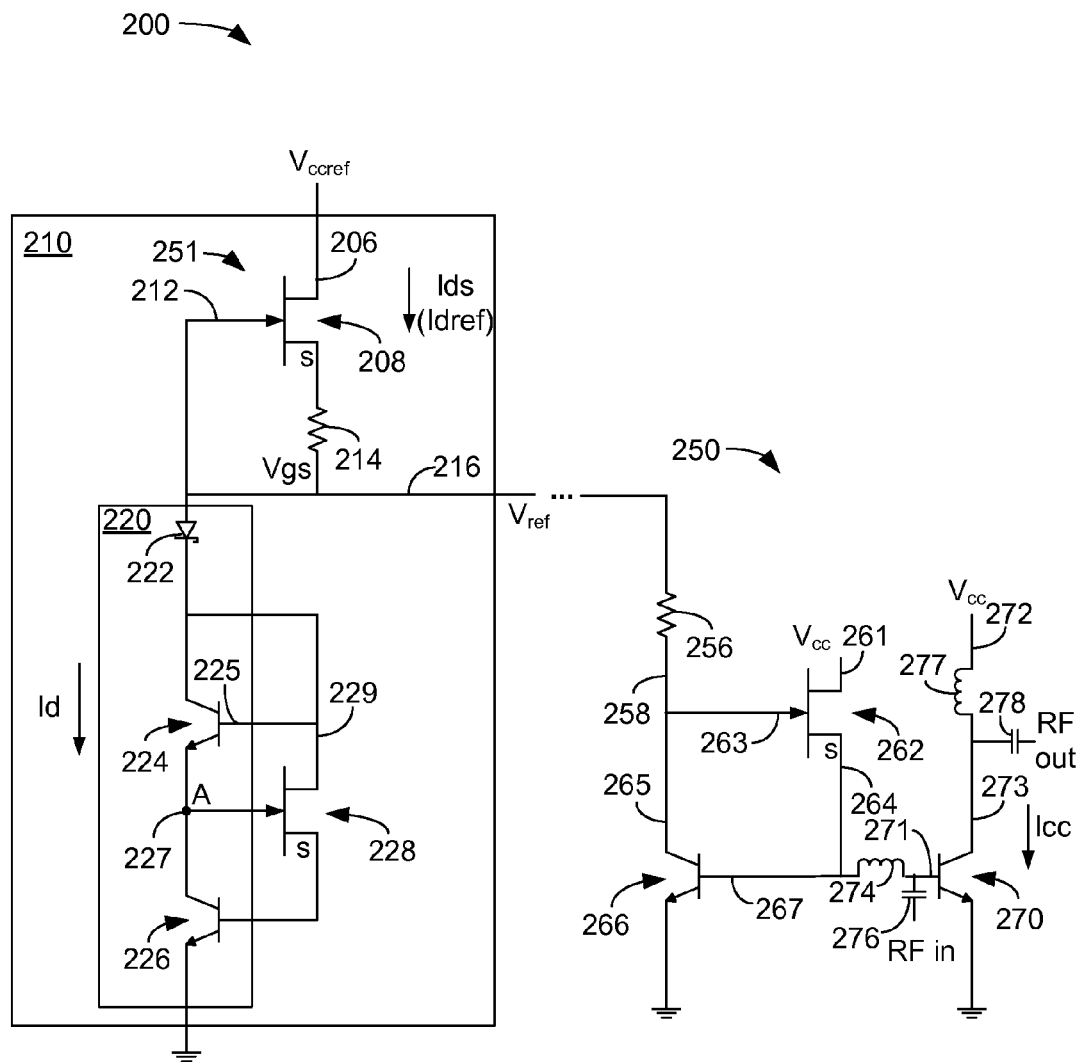
FIG. 3 is a schematic diagram illustrating a power amplifier system including an embodiment of a circuit for generating a reference voltage.

FIG. 3 is a schematic diagram illustrating a power amplifier system 200 including an embodiment of a circuit for generating a reference voltage. Embodiments of the circuit for generating a reference voltage can be used to compensate for variations in the $V_t$ and $I_{DSS}$ of the FET 208, which has similar function to the FET 156 of FIG. 2A. The reference system voltage provided to the FET 208 is referred to as "Vccref" to distinguish it from the system power supply voltage Vcc. The reference system voltage, Vccref, may be provided externally from the circuit 200, for example, by a controller (not shown), or can be generated in circuitry associated with the circuit 200. Alternatively, in some embodiments, the reference system voltage, Vccref, can be equal to, or identical to, the system power supply voltage, Vcc. Further, the reference system voltage, Vccref, may vary to a different degree than the system power supply voltage, Vcc. Further, Vccref and Vcc may fluctuate independently of each other.

The power amplifier system 200 includes a reference voltage circuit 210, a bias circuit 250, and a transistor amplifier 270. A radio frequency (RF) input signal is coupled to the base terminal 271 of the transistor amplifier 270 through a "DC-blocking" capacitor 276. An inductor 274 is used as an RF choke to prevent RF energy from entering the bias circuit 250. While illustrated as a single transistor amplifier 270, the transistor amplifier 270 may also represent a number of parallel RF transistor amplifier devices. In the embodiment illustrated in FIG. 3, the bias circuit 250 illustrates one of many possible uses and applications of the reference voltage circuit 210. Other variations and other applications of the reference voltage circuit 210 are possible. Further, the configuration of the bias circuit 250 shown in FIG. 3 is one example of a bias circuit that can set the bias conditions for the transistor amplifier 270 using the reference voltage, Vref, provided by the reference voltage circuit 210.

The bias circuit 250 comprises a resistor 256, which acts as a current source. The resistor 256 is coupled to the reference voltage node 216 and to a gate terminal 263 of a transistor 262 and to a collector terminal 265 of a transistor 266. The transistor 262 receives the system power supply voltage on connection 261. The source terminal 264 of the transistor 262 is coupled to a base terminal 267 of the transistor 266 and through the inductor 274 to the base terminal 271 of the transistor amplifier 270. The transistor amplifier 270 is the power amplifier output stage and the transistor 266 forms a current mirror with the transistor amplifier 270. A current mirror is well documented and understood by those having ordinary skill in the art. The transistor 262 is what is referred to as a "beta helper" for the transistor 270. The collector terminal 273 of the transistor amplifier 270 forms the RF output of the amplifier 270 and is connected through an inductor 277 to system power supply voltage, Vcc, on connection 272. The RF output is coupled out of the node 273 through a capacitor 278. The current Icc is the collector current for the transistor amplifier 270. Further, the voltage reference circuit 210 is not limited to applications involving the biasing of an RF amplifier stage. As will be discussed in more detail below, the current passing through resistor 256 controls the bias current to amplifier transistor 270.

The reference voltage circuit 210 includes components that provide compensation for process-induced variations to device parameters of the FET-based current source 251 and bias circuit 250. The current source 151 described previously in FIG. 2A is shown in FIG. 3 as current source 251, comprising FET 208 and resistor 214. Alternatively, in another embodiment, the resistor 214 can be removed (the gate and source of FET 208 are connected together) and, in yet another embodiment, a current source can be provided by the resistor 214 with the FET 208 omitted as shown in FIG. 2B. In such an embodiment, the FET 228 could be scaled proportionately, as described below.

In the embodiment illustrated in FIG. 3, the diode clamp circuit 220 comprises three diodes. However, there is no specific requirement to use three diodes, as the number of diodes are chosen as a function of turn-on voltage, Vccref, and other requirements. The first diode 222 is illustrated as a Schottky diode, but can be any type of diode depending on what diodes are available in the given process. The transistor 224 is a base-emitter diode, illustrated as a diode-connected HBT that has its base and collector terminals connected. The transistor 224 could be substituted with any other type of diode for similar function, again depending on turn-on voltage, Vccref, and other requirements. Transistor 226 adds an additional base-emitter ON voltage to the diode clamp circuit 220. Transistor 226 has its base connected to the source of the FET 228, and its collector connected to the gate of the FET 228 and to the emitter of the transistor 224.

As previously mentioned, the bias circuit 250 forms a current mirror that uses the reference voltage, Vref, to control the bias current in the transistor amplifier 270. The collector terminal 273 of the transistor amplifier 270 is connected to system power supply voltage, Vcc, on connection 272 through the inductor 277. Although shown as a FET, the "beta helper" transistor 262 may be fabricated using other processes. However, because the transistor 262 is fabricated as a FET in this embodiment, it is more sensitive to process variation than are the HBTs 266 and 270. The current in the transistor 266 is mirrored and scaled into the transistor amplifier 270 (which is typically larger than transistor 266) by forcing the base-emitter, Vbe, voltages of the transistors 266 and 270 to be equal. The beta helper transistor 262 is used when the base current consumed by transistor amplifier 270 is large enough to cause the current in the mirror to not scale properly. Because the transistor amplifier 270 is used as the RF amplifier in many applications, maintaining a substantially constant bias current through transistor amplifier 270 as system power supply voltage Vcc (battery voltage), and reference system voltage Vccref, vary is the main objective of the reference voltage circuit 210 and bias circuit 250.

To assist bias circuit 250 in supplying a substantially constant bias current to amplifier transistor 270, the reference voltage circuit 210 includes a compensation transistor 228. The transistor 228 is scaled relative to the transistors 208 and 262 and then optimized to provide compensation for process variations in the transistors 208 and 262.

There are a number of ways to implement the manner in which the FET 228 compensates for process variation in the FET 208 and FET 262, including, for example, modifying the scaling parameters of FET 228 or modifying the current flowing through the diode clamp circuit 220. In an embodiment using a processing technology that results in a FET having both a back-gate and a front gate, such as the FET devices shown in U.S. Pat. No. 5,250,826 and U.S. Pat. No. 6,906,359, it is possible to connect the compensation FET 228 such that it's back-gate is shorted to it's source terminal, and to connect the FETs 208 and 262 such that each device has its back-gate shorted to its gate terminal. In such an embodiment, FET 228 will have a more negative Vt than the Vt of the FETs 208 and 262. However, the Vt of FET 228 will continue to track the Vt of FET 208 and FET 262 in the given process technology. In this manner, compensation for process variation in FET 208 and FET 262 by the single device FET 228 is enhanced.

All of the devices shown in FIG. 3 are fabricated on the same die, and as such, respond similarly to changes in process, operating voltage, and operating temperature. In response to these conditions, transistors of the same kind can be defined as like devices; devices of the same kind that are fabricated on the same die, of similar scaling, of similar orientation, and using the same processing techniques. Compensation is achieved because the transistor 228 modifies the voltage, Vref, at the output 216 of the reference voltage circuit 210, opposite to the direction of change in Vref caused by $I_{ds}$ variation of the current source 251 as a result of the same variations in process and temperature.

More specifically, the current, $I_d$, through the diode clamp circuit 220, and the current, $I_{ds}$, of the current source 251 generate an output signal, Vref, according to Vref=2Vbe+ $V_{gs}$+$V_d$, where Vbe is the voltage drop across base-emitter diodes of transistors 224 and 226 (assuming for purposes here that transistors 224 and 226 are "like" transistors), $V_d$ is the diode drop across the diode 222, and Vgs is the voltage drop from the gate to the source of the compensation FET 228. The diodes are not ideal, and the voltage drops across the diodes are not constant as a function of Ids; but increase with increasing Ids according to the previously noted diode equation:

$$I_d \approx I_s \cdot \left(e^{\frac{V_d}{nV_{TH}}} - 1\right).$$

As a result of manufacturing variations of FET devices, it is well known that Vt varies inversely with $I_{DSS}$, or, in other words and for example, if $I_{DSS}$ is greater than nominal, Vt will be more negative than nominal. In more colloquial terms, when the channel becomes more conductive, a more negative voltage will be needed to turn the FET "OFF" (substantially non-conductive). The inverse relationship between $I_{DSS}$ (or simply $I_{DS}$ of the current source when resistor 214 is included) will be understood by those skilled in the art. When in forward active mode, the FETs 208 and 228 follow the previously noted equation $I_{ds} \approx K/2 \cdot (V_{gs}-V_t)^2$ when the condition Vds>(Vgs–Vt) is met. Clearly, $I_{ds}$ will increase if $V_{gs}$ increases or if $V_t$ decreases. Similarly, $I_{ds}$ is reduced if $V_{gs}$ drops. In this manner, when Vt drops in all FETs in the integrated circuit, as would be expected when the semiconductor process varies, the current, Ids, produced by the current source 251 increases. In turn, the sum of the base-emitter voltage drops, Vbe, across transistors 224 and 226 and the voltage drop, Vd, across diode 222 slightly increases as the diodes and transistors are driven by a larger amount of current. However, this change is countered by a greater decrease in the gate-source voltage, Vgs, of the compensation transistor 228, which when properly balanced, keeps Vref nearly constant. Properly balancing the compensation circuitry and diode clamp 220 generally includes determining the appropriate physical size of the transistor 228, the size of the diode 222, the size of the transistors 224 and 226, and determining the optimum current through the diode clamp circuit 220.

Voltage, process, and, in some embodiments, temperature compensation is also possible for like devices in the bias circuit that provide current to the transistor amplifier 270 if the circuit 200 is designed such that changes in the gate-source voltage, Vgs, in the compensation transistor 228 can compensate for process variation in both transistors 208 and 262. When subject to the same parameters, like devices are effectively compensated for voltage and process variations using the technique described herein. However, for the overall circuit 200, changes in temperature are compensated less effectively, as Vd and Vbe are stronger functions of temperature than the Vt of the FETs.

A single resistor 214 used as a current source 251 could be very useful for an implementation in which the supply voltage, Vcc, and/or the reference supply voltage, Vccref, is fixed. An example of such an implementation is a wireless LAN (WLAN) application, where both Vccref and Vcc can be connected to a fixed power supply, such as 3.3 or 5V. Other WLAN applications and non-cell phone applications might include a wireless transmitter for a computer. In such an implementation, Vccref may be fixed and Vcc may be variable. In such an implementation, because the FET 208 is omitted, the only FET element that would be compensated would be transistor 262, which can be more accurately compensated by the transistor 228.

Another alternative implementation is well suited to a system that uses a variable Vccref, where Vccref has a minimum value that is relatively high compared to the turn on voltage of the RF transistor technology, for example, a Vccref of 3.5V<Vccref<6V in a technology where $V_{be\_ON}$=1.4V. In such an implementation, it could be advantageous to implement the transistor 262 as a bipolar device. In such an implementation, the transistor 262 experiences little process variation and the compensation transistor 228 would compensate only the current-source transistor 208.

Figure 4:
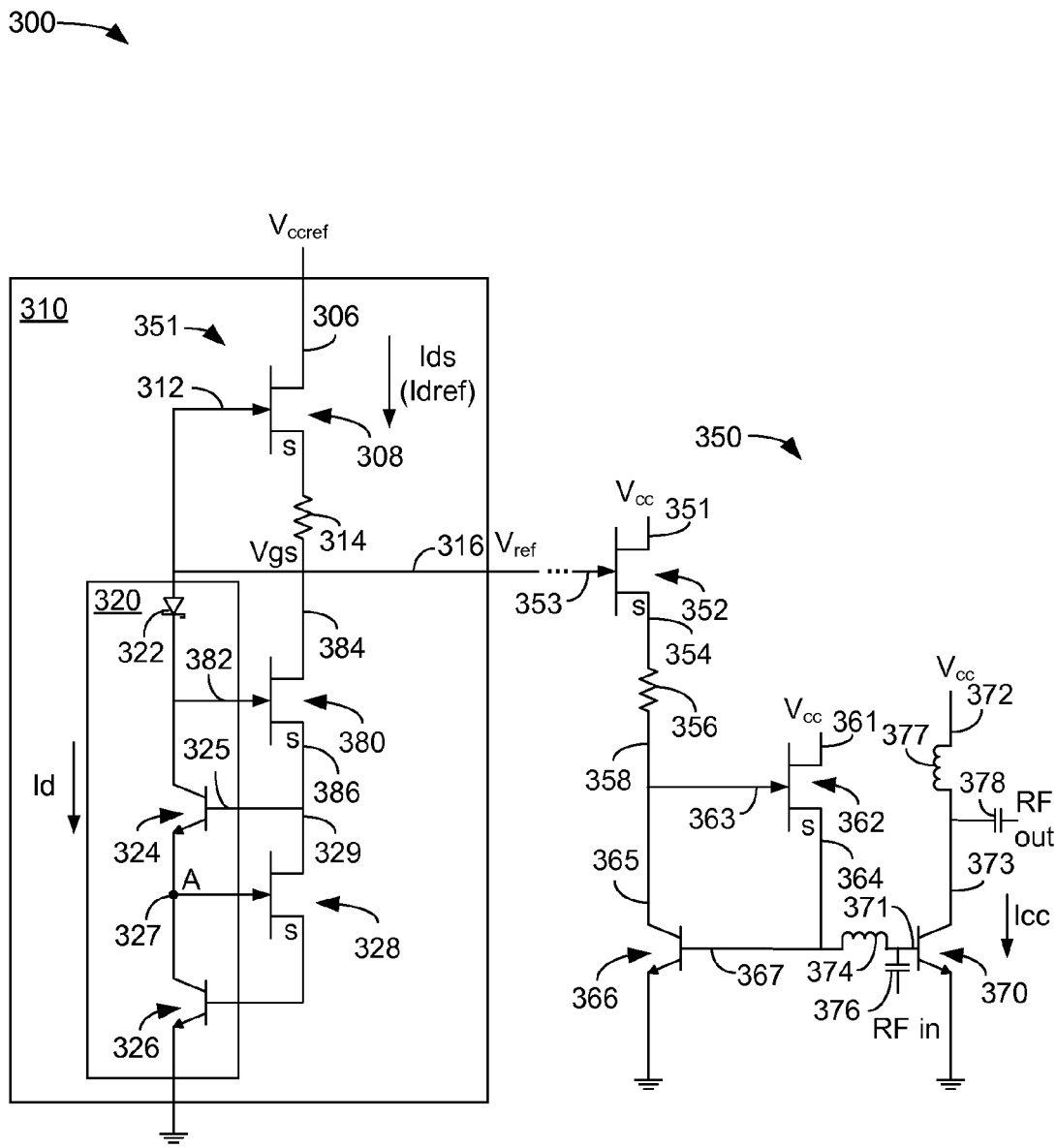
FIG. 4 is a schematic diagram illustrating a power amplifier system including an alternative embodiment of a circuit for generating a reference voltage of FIG. 3.

FIG. 4 is a schematic diagram illustrating a power amplifier system including an alternative embodiment of a circuit for generating a reference voltage of FIG. 3.

The power amplifier system 300 of FIG. 4 is similar to the power amplifier system 200 of FIG. 3, and similar elements will be designated with the reference numeral nomenclature 3XX, where "XX" in FIG. 4 refers to a similar element in FIG. 3. The bias circuit 350 includes a FET transistor 352. The transistor 352 isolates bias current in the bias circuit 350 from current in the reference generator circuit 310. In addition, the diode clamp circuit 320 includes a component to compensate for process changes in the transistor 352.

The reference voltage circuit 310 includes an additional compensation transistor 380 associated with the diode clamp circuit 320. The transistor 380 is similar in function to transistor 228 of FIG. 3. The gate terminal 382 of the transistor 380 is connected to the collector terminal of the transistor 324. The drain terminal 384 of the transistor 380 is connected to the reference voltage, Vref, on connection 316, and the source terminal 386 of the transistor 380 is coupled to the drain terminal 329 of the transistor 328 and to the base of the transistor 324.

The combination of the transistor 328 and the transistor 380 compensates for process and voltage variations in the transistor 308, the transistor 352, and the transistor 362.

As was the case for the transistor amplifier 270 (FIG. 3), in a wireless application, the transistor amplifier 370 is an RF transistor amplifier stage, and the current Icc is the collector current for the transistor amplifier 370. To obtain a saturated, or linear, amplifier with desirable RF characteristics, it is important that the collector current Icc remain relatively constant.

The voltage appearing at the base terminal 371 of the transistor amplifier 370 is supplied from the inductor 374 and the RF input is provided through the DC-blocking capacitor 376. The collector terminal 373 of the transistor amplifier 370 forms the RF output of the amplifier 370 and is connected through an inductor 377 to system voltage, Vcc, on connection 372. The RF output is coupled out of the node 373 through a capacitor 378. Further, the voltage reference circuit 310 is not limited to applications involving the biasing of an RF amplifier stage.

Figure 5:
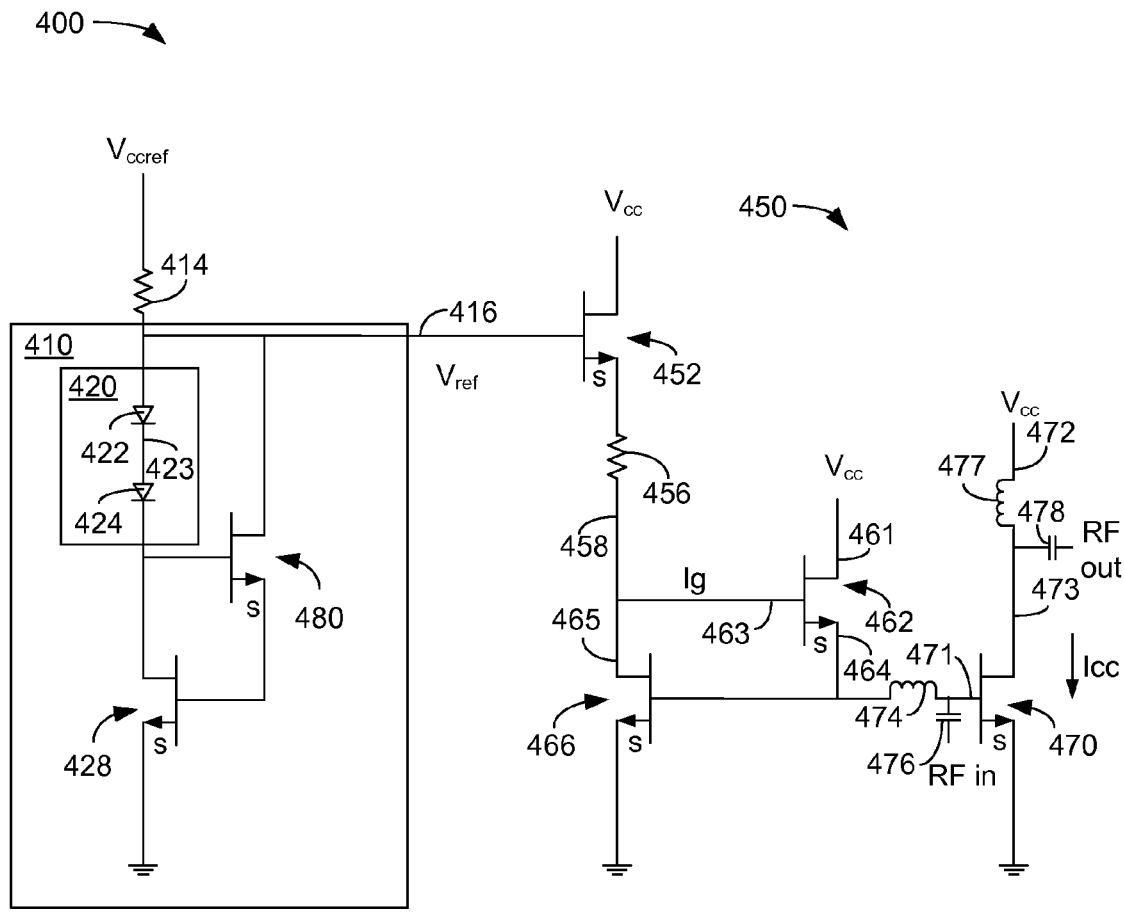
FIG. 5 is a schematic diagram illustrating a power amplifier system including an embodiment of the circuit for generating a reference voltage implemented using an enhancement mode nFET (n-type field-effect transistor) technology, such as a pseudomorphic high electron mobility transistor (PHEMT) technology.

FIG. 5 is a schematic diagram illustrating a power amplifier system including an embodiment of the circuit for generating a reference voltage implemented using nFET (n-type field effect transistor) technology. The embodiment shown in FIG. 5 illustrates enhancement mode (E-Mode) pseudomorphic high electron mobility transistor (PHEMT) technology.

The reference system voltage, Vccref, is provided through a resistor 414 to the reference voltage circuit 410. The reference voltage circuit 410 comprises a diode clamp circuit 420 and transistor devices 428 and 480, which, as mentioned above, are implemented as enhancement mode PHEMT devices. The diode clamp circuit 420 comprises diodes 422 and 424, which are illustrated as PN junction diodes, but which can be implemented using other technologies. The drain of FET transistor 480 is shown connected to node 416, but could also be connected to node 423.

The reference voltage, Vref, is provided over connection 416 to a gate terminal of an optional transistor 452. The optional transistor 452 functions to isolate bias current in the bias circuit 450 from current in the reference generator circuit 410, similar to the transistor 352 in FIG. 4. The source terminal of the transistor 452 is connected to a resistor 456. The resistor 456 is connected to the drain terminal 465 of a transistor 466 and to a gate terminal 463 of an optional transistor 462. The transistor 462 functions as a gate current (Ig) buffer, similar to the transistor 362 of FIG. 4. Though most e-mode PHEMT RF amplifier circuits nominally have negligible gate current, Ig, it is sometimes desirable to use a gate current buffer transistor 462 to prevent gate current leakage or in case Ig is nonzero due to the RF stage being overdriven.

In a wireless application, the transistor amplifier 470 is an RF transistor amplifier stage, and the current Icc is the collector current for the transistor amplifier 470. As mentioned above, to obtain a saturated or linear amplifier with desirable RF characteristics, it is important that the current, Icc, remain constant. The current, Icc, set by the voltage at node 416 (Vref), is desensitized to process variations by the diode clamp circuit 420, as described herein. The diode clamp circuit 420 helps compensate for the process and voltage variation (i.e., Vt and $I_{DSS}$ variation) in the transistors 462 and 452. Further, because the transistor 466 and the transistor amplifier 470 are e-mode PHEMT devices in the embodiment shown in FIG. 5, they are also vulnerable to more process variation than a bipolar device. Thus, process variation in the transistor 466 and in the transistor amplifier 470 can also be compensated by the diode clamp circuit 420.

The voltage appearing at the gate terminal 471 of the transistor device 470 is supplied from the inductor 474 and the RF input is provided through the DC-blocking capacitor 476. The drain terminal 473 of the transistor amplifier 470 forms the RF output of the amplifier 470 and is connected through an inductor 477 to system voltage, Vcc, on connection 472. The RF output is coupled out of the node 473 through a capacitor 478. The current Icc is the drain current for the transistor amplifier 470.

Figure 6:
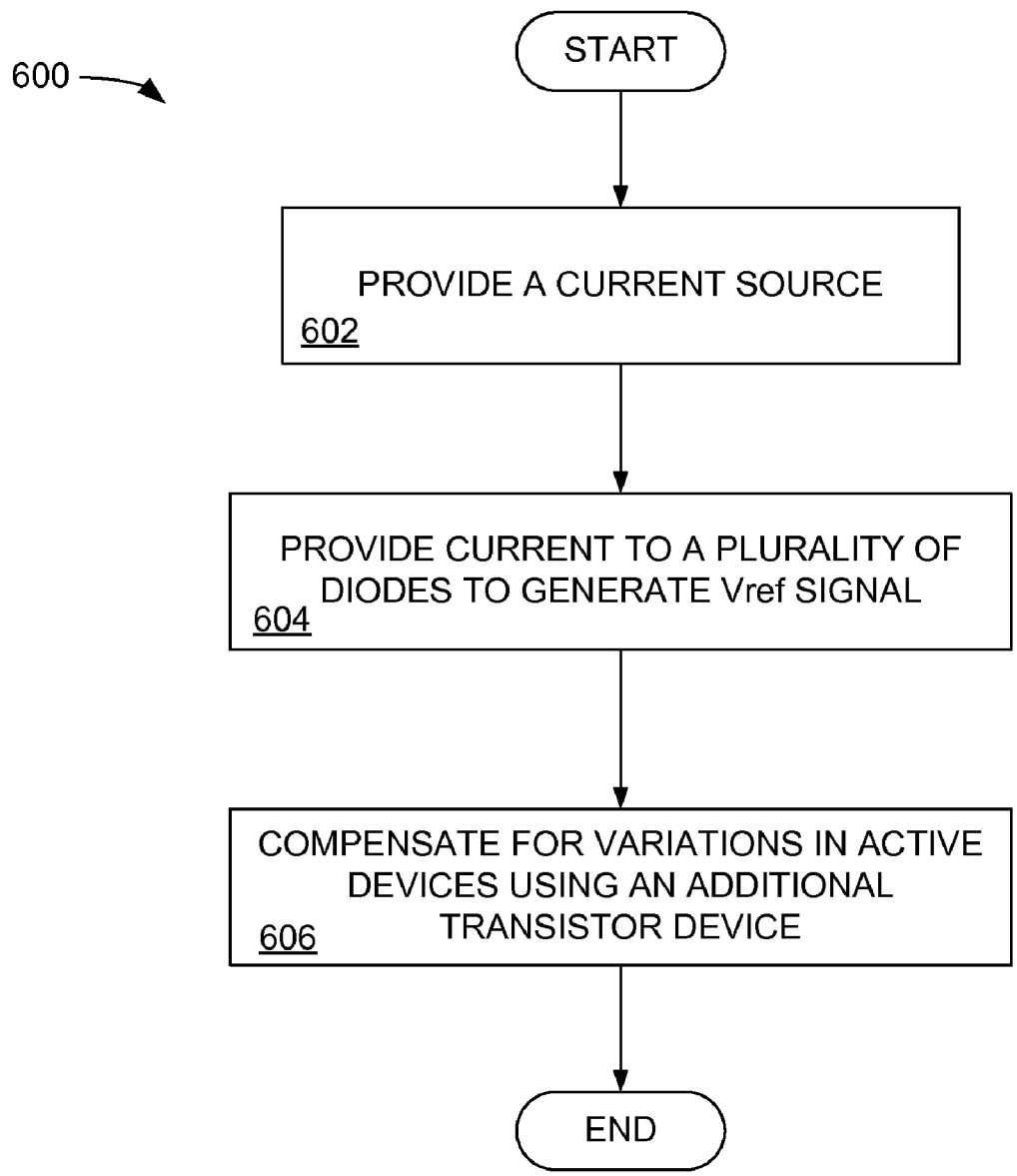
FIG. 6 is a flow chart describing the operation of an embodiment of the circuit for generating a bias voltage of FIGS. 3 and 4.

FIG. 6 is a flow chart describing the operation of an embodiment of the circuit for generating a bias voltage of FIG. 3. In block 602, a current source is provided. In an embodiment, the current source can be a transistor, such as transistor 208 (FIG. 3), or a resistor, as in FIG. 2B (element 154) and FIG. 5 (element 414). In block 604, the transistor 208 receives a system voltage supply and provides a current to a plurality of diodes, arranged for example, as a diode clamp circuit 220. The voltage drop across the diode clamp circuit 220 operates to provide a reference voltage, Vref. The reference voltage, Vref, is not dependent on the system voltage supply that is provided to the transistor 208.

In block 606 an additional transistor 228 (FIG. 3) modifies the diode voltage across the diode clamp circuit 220, thereby compensating for variations in other active devices. In the example of FIG. 3, because the transistor 208 that forms the current source is similar in electrical response to the transistor 228, the transistor 228 can modify the voltage across the diode clamp circuit 220 in a manner similar in magnitude to the way the transistor 208 modifies the reference voltage, Vref, on connection 216 (FIG. 3), such that the reference voltage, Vref, remains substantially stable over the range of process and voltage fluctuations.

While various embodiments of the invention have been described, it will be apparent to those of ordinary skill in the art that many more embodiments and implementations are possible that are within the scope of this invention.

What is claimed is:

1. A circuit for generating a reference voltage, comprising:
   a first transistor configured to receive a reference system voltage, the first transistor configured as a current source, the first transistor configured to provide a current independent of the system voltage;
   a plurality of diode devices configured to receive the current provided by the first transistor; and
   a second transistor associated with the plurality of diode devices, the second transistor configured to compensate for process variations in the first transistor, such that the plurality of diode devices provides a reference voltage that is at least partially compensated for the process variations.

2. The circuit of claim 1, wherein the second transistor modifies the reference voltage, opposite to a direction of change in the reference voltage caused by current variation in the first transistor as a result of the process variations.

3. The circuit of claim 2, further comprising:
   a bias circuit configured to receive the reference voltage, the bias circuit comprising a beta helper transistor, wherein the second transistor is configured to compensate for process variations in the beta helper transistor.

4. The circuit of claim 2, further comprising:
   a bias circuit configured to receive the reference voltage, the bias circuit comprising an isolation transistor; and
   a third transistor associated with the plurality of diode devices, the third transistor configured to compensate for process variations in the isolation transistor.

5. The circuit of claim 2, in which the second transistor compensates for process variations in the first transistor device by modifying a voltage across the plurality of diode devices.

6. The circuit of claim 2, in which at least one of the plurality of diode devices is a transistor.

7. A portable transceiver having a circuit for generating a reference voltage, comprising:
   a transmitter operatively coupled to a receiver;
   a power amplifier element including:
   a first transistor configured to receive a reference system voltage, the first transistor configured as a current source, the first transistor configured to provide a current independent of the system voltage;
   a plurality of diode devices configured to receive the current provided by the first transistor; and
   a second transistor associated with the plurality of diode devices, the second transistor configured to compensate for process variations in the first transistor, such that the plurality of diode devices provides a reference voltage that is at least partially compensated for the process variations.

8. The transceiver of claim 7, wherein the second transistor modifies the reference voltage, opposite to a direction of change in the reference voltage caused by current variation in the first transistor as a result of the process variations.

9. The transceiver of claim 8, further comprising:
   a bias circuit configured to receive the reference voltage, the bias circuit comprising a beta helper transistor, wherein the second transistor is configured to compensate for process variations in the beta helper transistor.

10. The transceiver of claim 8, further comprising:
    a bias circuit configured to receive the reference voltage, the bias circuit comprising an isolation transistor; and
    a third transistor associated with the plurality of diode devices, the third transistor configured to compensate for process variations in the isolation transistor.

11. The transceiver of claim 8, in which the second transistor compensates for process variations in the first transistor by modifying a voltage across the plurality of diode devices.

12. The transceiver of claim 8, in which at least one of the plurality of diode devices is a transistor.

13. A method for generating a reference voltage, comprising:
    providing a reference system voltage to a first transistor configured as a current source, the first transistor configured to provide a current;
    providing the current to a plurality of diode devices; and
    compensating for process variations in the first transistor using a second transistor associated with the plurality of diode devices, such that the plurality of diode devices provide a reference voltage that is at least partially compensated for the process variations.

14. The method of claim 13, further comprising modifying the reference voltage, opposite to a direction of change in the reference voltage caused by current variation in the first transistor as a result of the process variations.

15. The method transceiver of claim 14, further comprising:
    providing the reference voltage to a bias circuit, the bias circuit comprising a beta helper transistor; and
    compensating for process variations in the beta helper transistor using the second transistor.

16. The method of claim 14, further comprising:
    providing the reference voltage to a bias circuit, the bias circuit comprising an isolation transistor; and
    compensating for process variations in the isolation transistor using a third transistor associated with the plurality of diode devices.

17. The method of claim 14, further comprising compensating for process and voltage variations in the first transistor by using the second transistor to modify a voltage across the plurality of diode devices.

18. The method of claim 14, in which at least one of the plurality of diode devices is a transistor.

19. A circuit for generating a reference voltage, comprising:
    a current source configured to receive a reference system voltage and configured to provide a current; and
    a plurality of diode devices configured to receive the current provided by the current source, the plurality of diode devices configured to compensate for variations in the reference system voltage such that the plurality of diode devices provides a reference voltage that is at least partially compensated for variations in the reference system voltage.

* * * * *

UNITED STATES PATENT AND TRADEMARK OFFICE
CERTIFICATE OF CORRECTION

PATENT NO. : 8,350,418 B2
APPLICATION NO. : 12/572337
DATED : January 8, 2013
INVENTOR(S) : Metzger et al.

Page 1 of 1

It is certified that error appears in the above-identified patent and that said Letters Patent is hereby corrected as shown below:

In the Claims:

In column 12 at line 36, In Claim 15, change "method transceiver" to --method--.

Signed and Sealed this
First Day of October, 2013

Teresa Stanek Rea
*Deputy Director of the United States Patent and Trademark Office*